United States Patent
Kawai et al.

(10) Patent No.: US 7,295,045 B2
(45) Date of Patent: Nov. 13, 2007

(54) CIRCUIT FOR CUTTING-OFF OUTPUT SIGNAL

(75) Inventors: Takaaki Kawai, Obu (JP); Junji Hayakawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/296,464

(22) Filed: Dec. 8, 2005

(65) Prior Publication Data
US 2006/0164129 A1    Jul. 27, 2006

(30) Foreign Application Priority Data
Jan. 27, 2005    (JP)    ............................. 2005-020177

(51) Int. Cl.
*H03K 5/22*    (2006.01)
(52) U.S. Cl. .............................. 327/77; 327/78; 327/81
(58) Field of Classification Search ...................... None
See application file for complete search history.

(56) References Cited
U.S. PATENT DOCUMENTS

| | | | |
|---|---|---|---|
| 5,245,526 A * | 9/1993 | Balakrishnan et al. ........ 363/97 |
| 5,396,117 A * | 3/1995 | Housen et al. ............... 327/480 |
| 5,467,242 A * | 11/1995 | Kiraly ......................... 361/94 |
| 5,831,466 A * | 11/1998 | Pulvirenti et al. ........... 327/309 |
| 7,046,013 B2 * | 5/2006 | Uematsu et al. ............. 324/525 |
| 7,084,675 B2 * | 8/2006 | Lim ............................ 327/78 |
| 2003/0197513 A1 | 10/2003 | Uematsu et al. |

* cited by examiner

*Primary Examiner*—Kenneth B. Wells
*Assistant Examiner*—An T. Luu
(74) *Attorney, Agent, or Firm*—Posz Law Group, PLC

(57) ABSTRACT

An output signal cutting-off circuit includes a first switching element, a driving circuit and a voltage-drop-signal generating circuit. When a voltage to be monitored becomes lower than a threshold voltage, a voltage-drop-signal is generated and supplied to the driving circuit. The driving circuit turns on the first switching element based on the voltage-drop-signal to thereby cut off an output signal voltage by bringing it to a ground potential. When the voltage-drop-signal disappears, the first switching element is turned off to bring the output signal to a normal state. Preferably, a second switching element for charging a capacitor and a third switching element for discharging the capacitor are used in the driving circuit. In this case, the first switching element is turned on or off based on a voltage of the capacitor.

17 Claims, 3 Drawing Sheets

CIRCUIT FOR CUTTING-OFF OUTPUT SIGNAL

CROSS-REFERENCE TO RELATED APPLICATION

This application is based upon and claims benefit of priority of Japanese Patent Application No. 2005-20177 filed on Jan. 27, 2005, the content of which is incorporated herein by reference.

BACKGROUND OF THE INVENTION

1. Field of the Invention

The present invention relates to an electric circuit for cutting-off an output signal when a voltage to be monitored becomes lower than a predetermined level.

2. Description of Related Art

An example of a circuit for cutting-off an output signal is disclosed in JP-A-2003-304633. The circuit is for detecting an open-circuit failure. An essential portion of the circuit is shown in FIG. 5 attached hereto. A signal line 112 of a function circuit 101 is connected to a power source line 141 through a resistor 121 and to a ground line 113 through a resistor 122. The power source line 111 is connected to the ground line 113 through a resistor 123.

The power source line 111 of the function circuit 101 is connected to a power source line 141 of a host circuit 104 that supplies power to the function circuit 101. The signal line 112 of the function circuit 101 is connected to an output signal terminal 145 through a signal line 142 of the host circuit 104. The function circuit 101 includes a signal generating circuit 103. Signals from an amplifier 131 in the signal generating circuit 103 are outputted from the output signal terminal 145 through the signal lines 112, 142. The ground line 113 of the function circuit 101 is connected to a ground line 143 of the host circuit 104. R01, R02 and R03 show internal resistances in the signal generating circuit 103.

In the host circuit 104, the power source line 141 is connected to the signal line 142 through an internal resistance 124, and the signal line 142 is connected to the ground line 143 through an internal resistance 125. The power source line 141 and the ground line 143 of the host circuit 104 are connected to a power source terminal 144 and a ground terminal 146, respectively.

When the circuit for detecting an open-circuit failure described above is applied to a sensor for an automobile, such as a semi-conductor pressure sensor, a voltage of 5 volts is supplied to the function circuit 101 as a power source voltage VCC. When the circuit is functioning without an open-circuit failure, an output signal voltage of the function circuit 101 varies in a range of 0.3-4.8 volts. If the power supply to the signal generating circuit 103 is discontinued because of an open-circuit in the power source lines in the function circuit 101 and the host circuit 104, the output signal voltage Vout is cut-off by a pull-down resistance that connects the signal lines 112, 142 to the ground lines 113, 143. The output signal voltage Vout becomes to a ground voltage level which is lower than an normal output signal voltage. In this manner, the circuit proposed by JP-A-2003-304633 prevents the output signal voltage from becoming unstable when the open-circuit failure occurs.

In the proposed circuit, the output signal voltage Vout is cut-off by connecting pull-down resistances to the signal lines 112 and 142. However, the following problems are involved in the proposed circuit. First, an output capacity of the amplifier 131 in the signal generating circuit 103 has to be increased because a current always flows through the pull-down resistances. This results in higher power consumption in detecting the open-circuit failure. Secondly, the output signal voltage Vout may not decrease to the ground level immediately after an open-circuit failure or a decrease in the power source voltage VCC occurs. The delay is caused by charges stored in capacitors connected to the signal lines 112, 142 and to the power source lines 111, 141, though these capacitors are not shown in FIG. 5.

SUMMARY OF THE INVENTION

The present invention has been made in view of the above-mentioned problems, and an object of the present invention is to provide an improved circuit for cutting-off an output signal, in which the output signal is immediately cut off when a power source voltage decreases while minimizing power consumption.

An output signal from a signal generating circuit is cut off, or brought to a ground potential, by a circuit for cutting-off an output signal when a voltage to be monitored, such as a power source voltage, becomes lower than a threshold voltage. The cutting-off circuit is composed of: a voltage-drop-signal generating circuit that generates a voltage-drop-signal when the voltage to be monitored becomes lower than the threshold voltage, a first switching element, such as a MOS-FET transistor; and a driving circuit for turning on or off the first switching element.

When the voltage-drop-signal is generated, the first switching element is turned on by the driving circuit to thereby bring the output signal to a ground potential. In other words, the output signal is cut off when the voltage to be monitored becomes lower than the threshold voltage. On the other hand, when the voltage to be monitored recovers its normal voltage, the first switching element is turned off to thereby terminate the cutting-off operation.

The driving circuit may include a second switching element, a diode and a capacitor. In this case, the second switching element is turned on when the voltage-drop-signal is generated to charge the capacitor through the diode that allows current to flow only in the direction from the second switching element to the capacitor. The first switching element is turned on by a voltage of the charged capacitor. Further, a third switching element for quickly discharge the capacitor when the voltage-drop-signal disappears may be used in the driving circuit. It is preferable to use a field-effect transistor, a base of which is connected to the capacitor, as the first switching element to maintain its on-state for a long period when necessary. The voltage to be monitored may be a voltage supplied to the output cutting-off circuit as a power source voltage, or a voltage supplied to the signal generating circuit as an input signal for generating the output signal.

According to the present invention, the output signal is cut off immediately when the voltage to be monitored becomes lower than the threshold voltage, while minimizing power consumption in the output signal cutting-off circuit. Other objects and features of the present invention will become more readily apparent from a better understanding of the preferred embodiment described below with reference to the following drawings.

DETAILED DESCRIPTION OF THE PREFERRED EMBODIMENT

A preferred embodiment of the present invention will be described with reference to FIGS. 1-4. A circuit for cutting-off an output signal according to the present invention is applied, for example, to a signal generating circuit in an acceleration detector or a pressure sensor for use in an automotive vehicle. The circuit may be applied to other signal output circuits outputting signals obtained by calculations carried out therein.

Figure 1:
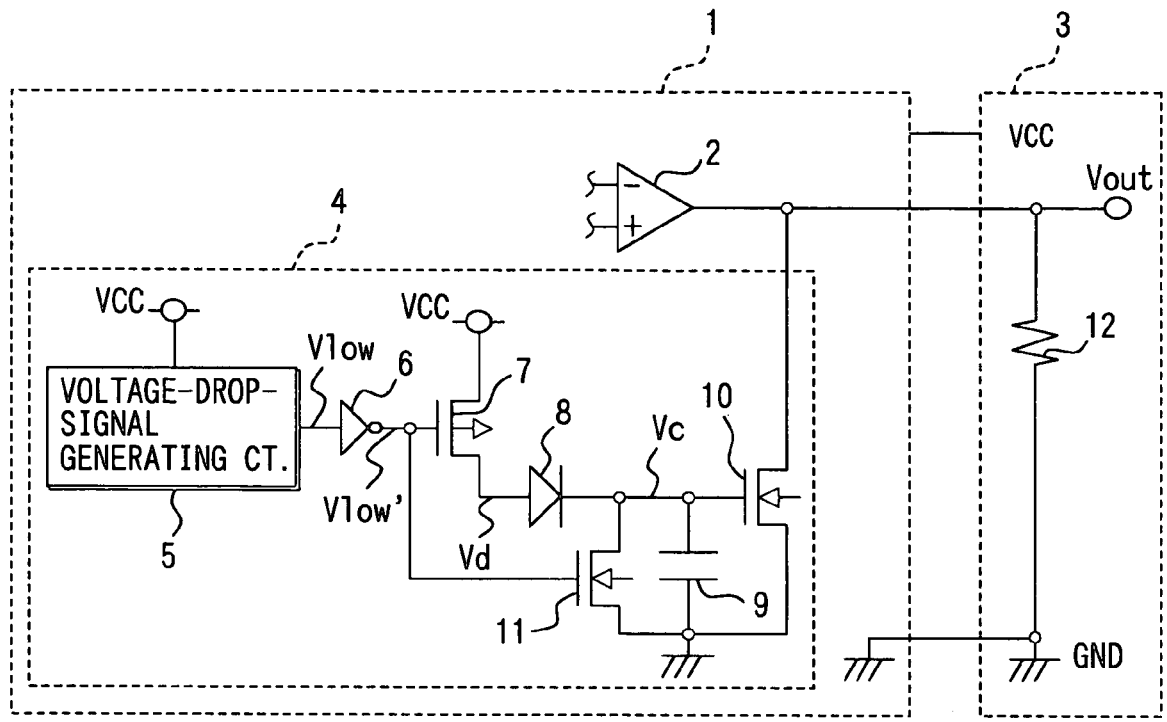
FIG. 1 is a diagram showing a circuit for cutting-off an output signal according to the present invention.

FIG. 1 shows an entire circuit including a circuit 4 for cutting-off an output signal (referred to as an output cutting-off circuit 4) according to the present invention. The output cutting-off circuit 4 is included in a signal generating circuit 1. The signal generating circuit 1 includes an amplifier 2 for amplifying a signal, such as a signal from an acceleration sensor of an automobile. A power source voltage VCC and a ground potential GND are supplied to the signal generating circuit 1 from an electronic control unit 3 (referred to as an ECU 3) as a host circuit of the signal generating circuit 1.

An output signal Vout from the signal generating circuit 1 is fed to the ECU 3. The ECU 3 includes a pull-down resistor 12 connected between the Vout terminal and the GND terminal, so that the output signal voltage Vout can be brought to the GND voltage level when any accident occurs in the circuit. A resistance value of the pull-down resistor 12 is set to a very high value, such as 100 kΩ, so that an amount of current flowing through the pull-down resistor 12 is negligibly small in a normal state.

The output cutting-off circuit 4 included in the signal generating circuit 1 cuts off the output signal Vout from the signal generating circuit 1 when the power source voltage VCC becomes lower than a threshold voltage Vth. In other words, the output signal voltage Vout is brought to the ground potential GND when the power source voltage VCC becomes lower than the threshold voltage Vth. In order to detect whether the power source voltage becomes lower than the threshold voltage Vth, a circuit for generating a voltage-drop-signal Vlow (shown in FIG. 2) is included in the output cutting-off circuit 4.

Figure 2:
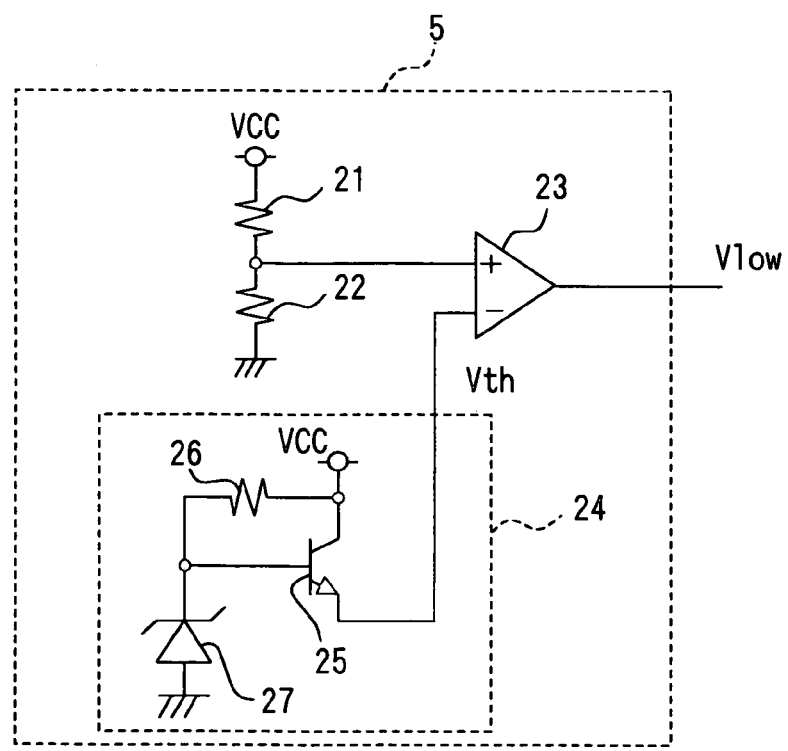
FIG. 2 is a diagram showing a circuit for generating a voltage-drop-signal used in the circuit shown in FIG. 1.

As shown in FIG. 2, the voltage-drop-signal generating circuit 5 has a pair of resistors 21, 22 for dividing the power source voltage VCC. The divided voltage is supplied to one terminal of a comparator 23. The threshold voltage Vth is fed to the other terminal of the comparator 23 from a threshold voltage generating circuit 24. The threshold voltage generating circuit 24 is composed of a control transistor 25, a resistor 26 and a Zener diode 27. The threshold voltage Vth is stabilized by a Zener voltage of the Zener diode 27, i.e., the stabilized threshold voltage Vth is obtained when the power source voltage VCC decreases.

When the power source voltage VCC decreases, the divided voltage supplied to one terminal (+) of the comparator 23 becomes lower than the threshold voltage Vth supplied to the other terminal (−) of the comparator 23. Accordingly, the voltage-drop-signal Vlow indicating that the power source voltage VCC becomes lower than the threshold voltage Vth is outputted from the comparator 23. The voltage-drop-signal Vlow is a high level signal (a H-level signal). The level of the voltage-drop-signal Vlow varies according to the power source voltage VCC as shown in the second graph in FIG. 4.

As shown in FIG. 1, an inverter 6, to which the voltage-drop-signal Vlow is fed, is connected to the voltage-drop-signal generating circuit 5. The inverter 6 outputs an inverted signal Vlow' that is fed to both gates of a P-channel MOS-FET (field-effect-transistor) 7 and an N-channel MOS-FET 11. When the inverted signal Vlow' is L-level (low level), the P-channel MOS-FET 7 is turned on while the N-channel MOS-FET 11 is turned off. On the other hand, when the inverted signal Vlow' is H-level, the P-channel MOS-FET 7 is turned off while the N-channel MOS-FET 11 is turned on.

Figure 3A:
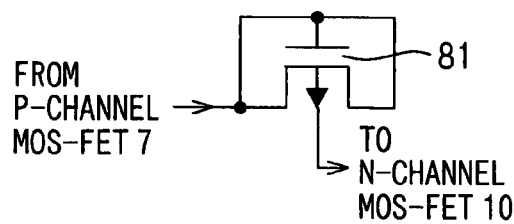
FIGS. 3A and 3B show alternative examples of a diode for preventing discharge of a capacitor.
Figure 3B:
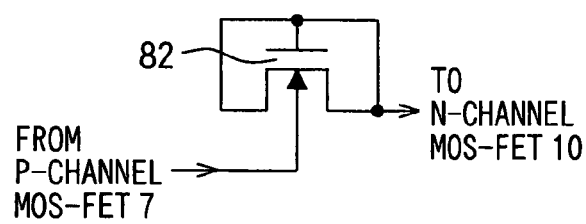

A source terminal of the P-channel MOS-FET 7 is connected to the power source voltage VCC, and its drain terminal is connected to a diode 8 which is further connected to a capacitor 9. That is, the capacitor 9 is charged with a diode voltage Vd supplied from the P-channel MOS-FET 7 when a capacitor voltage Vc is lower than the diode voltage Vd. On the other hand, when the capacitor voltage Vc is higher than the diode voltage Vd, discharge of the capacitor 9 is prevented by the diode 8. A P-channel MOS-FET 81 connected as shown in FIG. 3A may be used in place of the diode 8. Alternatively, an N-channel MOS-FET 82 connected as shown in FIG. 3B may be used in place of the diode 8.

An N-channel MOS-FET 10 is connected between an output signal line outputting the output signal voltage Vout and the ground. That is, a drain terminal of the N-channel MOS-FET 10 is connected to the output signal line, and its source terminal is connected to the ground. The capacitor voltage Vc is supplied to a gate of the N-channel MOS-FET 10. The N-channel MOS-FET 10 is turned on when the capacitor voltage Vc exists, and thereby the output line potential is brought to the ground level potential, i.e., the output signal Vout is cut off. On the other hand, when the capacitor voltage Vc does not exists, i.e. when the capacitor 9 is discharged, the N-channel MOS-FET 10 is turned off.

A drain terminal of the N-channel MOS-FET 11 is connected to a point between the diode 8 and the capacitor 9, and its source terminal is grounded. The inverted signal Vlow' is supplied to the gate of the N-channel MOS-FET 11. When the N-channel MOS-FET 11 is turned on, the capacitor voltage Vc is immediately discharged through the N-channel MOS-FET 11.

The plural switching elements in the output cutting-off circuit 4 are made of a CMOS circuit. Therefore, power consumption in the output cutting-off circuit is suppressed. In particular, the switching circuit driven by the capacitor voltage Vc is formed by a field-effect transistor, i.e., the N-channel MOS-FET 10. Therefore, the capacitor voltage Vc is not discharged through the N-channel MOS-FET 10, and accordingly the N-channel MOS-FET 10 can be kept turned on for a long period of time.

Figure 4:
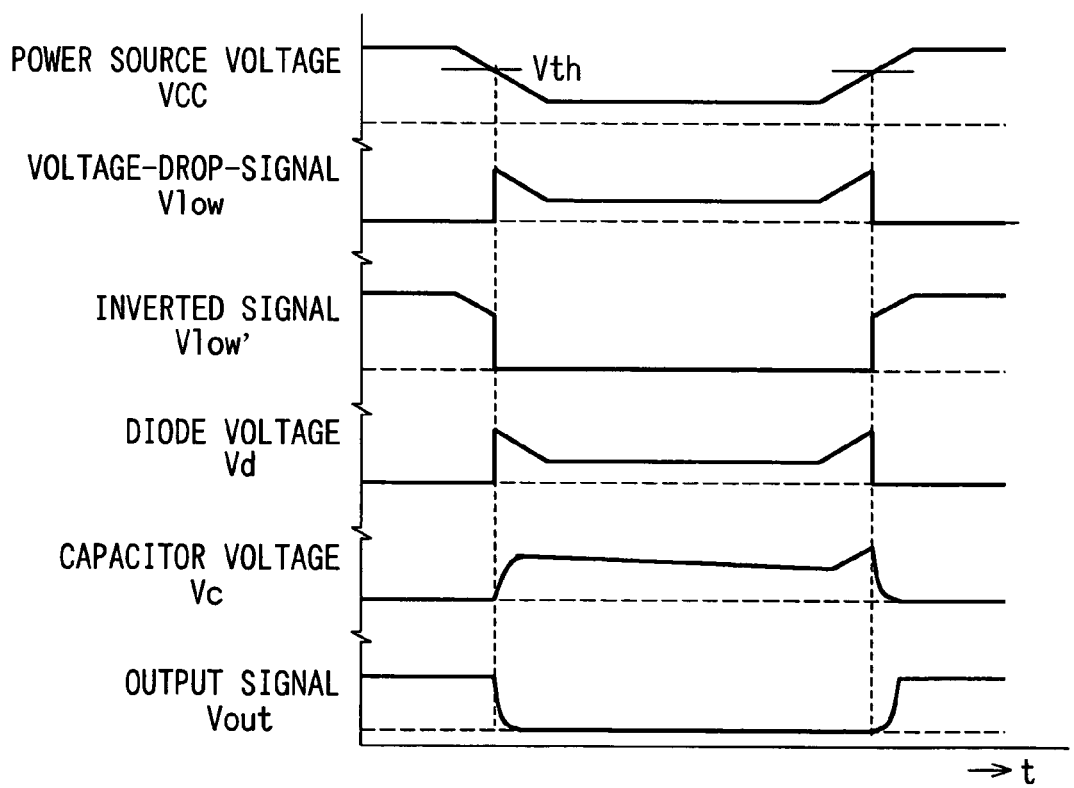
FIG. 4 shows graphs of various waveforms in the output signal cutting-off circuit.
Figure 5:
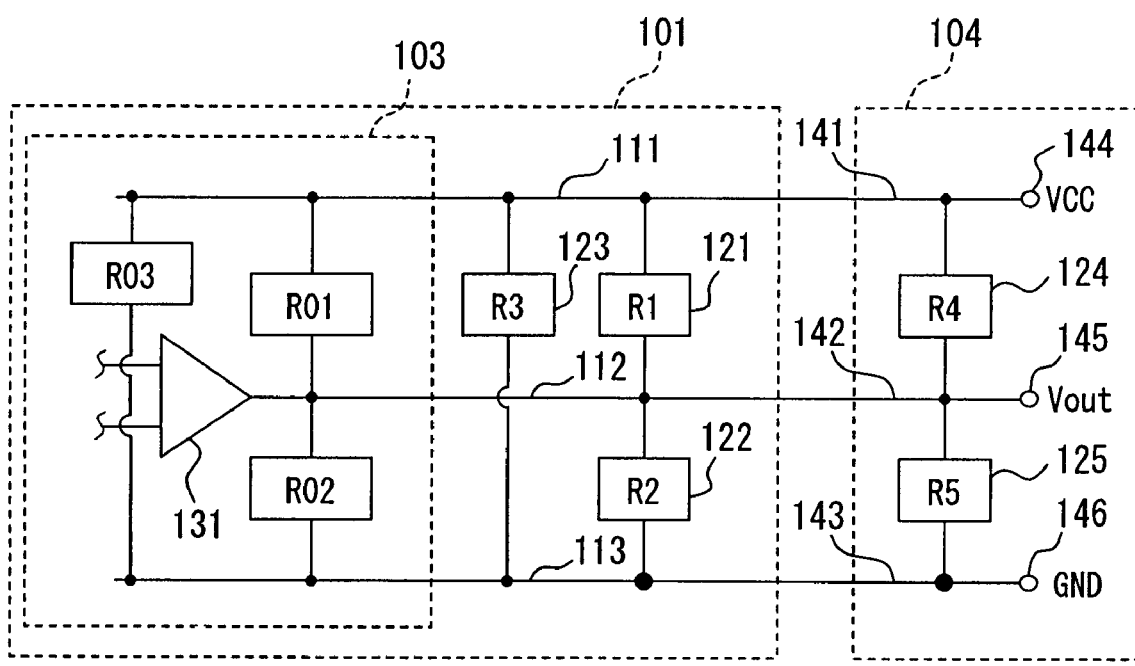
FIG. 5 is a diagram showing a conventional output signal cutting-off circuit.

Operation of the output cutting-off circuit 4 will be described below with reference to waveforms shown in FIG. 4. When the power source voltage VCC becomes lower than the threshold voltage Vth, the voltage-drop-signal Vlow at H-level is outputted from the voltage-drop-signal generating circuit 5. The voltage-drop-signal Vlow is inverted by the inverter 6 to the inverted signal Vlow' at L-level. This means that the Vlow' signal at L-level is outputted when the power source voltage VCC becomes lower than the threshold voltage Vth.

The P-channel MOS-FET 7 is turned on and the N-channel MOS-FET 11 is turned off by the inverted signal Vlow' at L-level. The capacitor 9 is charged with the power source voltage VCC through the P-channel MOS-FET 7 and the diode 8, and thereby the capacitor voltage Vc appears at a terminal of the capacitor 9. The capacitor voltage Vc is supplied to the gate of the N-channel MOS-FET 10, and thereby the N-channel MOS-FET 10 is turned on to bring the output signal voltage Vout to the ground level. Since a capacitor (not shown) for removing noises is connected to the output signal line, the output singal Vout is dropped to the ground level with a slight delay, as shown in the bottom graph in FIG. 4. Since discharge of the capacitor voltage Vc is prevented by the diode 8, the N-channel MOS-FET 10 is kept turned on during a period in which the power source voltage VCC is lower than the threshold voltage Vth. That is, the output signal voltage Vout is kept at the ground level during this period.

When the power source voltage VCC recovers and becomes higher than the threshold voltage Vth, the voltage-drop-signal generator 5 outputs the voltage-drop-signal Vlow at L-level which is inverted to the Vlow' signal at H-level. The P-channel MOS-FET 7 is turned off and the N-channel MOS-FET 11 is turned on by the Vlow' signal at H-level. The capacitor voltage Vc is immediately discharged through the N-channel MOS-FET 11. As a result, the N-channel MOS-FET 10 is turned off to recover the output signal voltage Vout.

As explained above, the N-channel MOS-FET 10 is turned on by the voltage-drop-signal that is generated when the power source voltage VCC becomes lower than the threshold voltage Vth. The output signal Vout is immediately brought to the ground level by turning on the N-channel MOS-FET 10, i.e., the output signal Vout is quickly cut off. When the power source voltage VCC is normal (higher than the threshold voltage Vth), the N-channel MOS-FET 10 is kept non-conductive. Accordingly, no current flows through the N-channel MOS-FET 10, and power is not consumed when the power source voltage VCC is normal. Further, since the capacitor voltage Vc is quickly discharged when the power source voltage VCC becomes higher than the threshold voltage Vth, the cutting-off of the output signal Vout is immediately terminated.

The present invention is not limited to the embodiment described above, but it may be variously modified. For example, though the power source voltage VCC is monitored in the embodiment described above, an input voltage supplied to the signal generating circuit 1 for generating the output signal Vout may be monitored. In this case, the output signal Vout is cut off when the input voltage becomes lower than a predetermined level in the same manner as in the embodiment described above. However, if the VCC is stable, the diode 8 and the capacitor 9 may be eliminated and the N-channel MOS-FET 10 may be turned on directly by a voltage supplied from the P-channel MOS-FET 7. Though the switching elements in the output cutting-off circuit 4 are constituted by CMOS in the foregoing embodiment, it is possible to use bipolar transistors as those switching elements.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A circuit for cutting-off an output signal outputted from a signal generating circuit, comprising:
   a voltage-drop-signal generating circuit for outputting a voltage-drop-signal when a voltage to be monitored becomes lower than a threshold voltage;
   a first switching element for grounding the output signal; and
   a driving circuit for turning on the first switching element thereby to ground the output signal when the voltage-drop-signal is generated,
   wherein the voltage to be monitored is either a supply voltage, or a signal derived from the supply voltage.

2. The circuit for cutting-off an output signal as in claim 1, wherein the driving circuit includes:
   a second switching element which is turned on when the voltage-drop-signal is generated;
   a capacitor which is charged via the second switching element when the second switching element is turned on; and
   a diode, connected between the second switching element and the capacitor for preventing discharge of the capacitor, wherein the first switching element is turned on by a voltage of the capacitor.

3. The circuit for cutting-off an output signal as in claim 2, wherein at least the first switching element is constituted by a field-effect transistor.

4. The circuit for cutting-off an output signal as in claim 2, wherein the driving circuit further includes a third switching element which is turned on when the voltage-drop-signal disappears to thereby discharge the capacitor.

5. The circuit for cutting-off an output signal as in claim 1, wherein the voltage to be monitored is a voltage supplied to the circuit for cutting-off an output as a power source voltage.

6. The circuit for cutting off an output signal as in claim 1, wherein the voltage to be monitored is a voltage supplied to the signal generating circuit for generating the output signal.

7. The circuit for cutting off an output signal as in claim 1, wherein the threshold voltage is greater than 0 volts.

8. A circuit for cutting-off an output signal outputted from a signal generating circuit, comprising:
   a voltage-drop-signal generating circuit for outputting a voltage-drop-signal when a voltage to be monitored becomes lower than a threshold voltage;
   a first switching element for grounding the output signal; and
   a driving circuit for turning on the first switching element thereby to ground the output signal when the voltage-drop-signal is generated,
   wherein the driving circuit includes:
      a second switching element which is turned on when the voltage-drop-signal is generated;
      a capacitor which is charged via the second switching element when the second switching element is turned on; and
      a diode, connected between the second switching element and the capacitor for preventing discharge of the capacitor, wherein the first switching element is turned on by a voltage of the capacitor.

9. The circuit for cutting-off an output signal as in claim 8, wherein at least the first switching element is constituted by a field-effect transistor.

10. The circuit for cutting-off an output signal as in claim 8, wherein the driving circuit further includes a third switching element which is turned on when the voltage-drop-signal disappears to thereby discharge the capacitor.

11. The circuit for cutting-off an output signal as in claim 8, wherein the voltage to be monitored is a voltage supplied to the circuit for cutting-off an output as a power source voltage.

12. The circuit for cutting off an output signal as in claim 8, wherein the voltage to be monitored is a voltage supplied to the signal generating circuit for generating the output signal.

13. The circuit for cutting off an output signal as in claim 8, wherein the threshold voltage is greater than 0 volts.

14. A circuit for cutting-off an output signal outputted from a signal generating circuit, comprising:
- a voltage-drop-signal generating circuit for outputting a voltage-drop-signal when a voltage to be monitored becomes lower than a constant threshold voltage;
- a first switching element for grounding the output signal; and
- a driving circuit for turning on the first switching element thereby to ground the output signal when the voltage-drop-signal is generated.

15. The circuit for cutting-off an output signal as in claim 14, wherein the driving circuit includes:
- a second switching element which is turned on when the voltage-drop-signal is generated;
- a capacitor which is charged via the second switching element when the second switching element is turned on; and
- a diode, connected between the second switching element and the capacitor for preventing discharge of the capacitor, wherein the first switching element is turned on by a voltage of the capacitor.

16. The circuit for cutting-off an output signal as in claim 14, wherein at least the first switching element is constituted by a field-effect transistor.

17. The circuit for cutting-off an output signal as in claim 14, wherein the driving circuit further includes a third switching element which is turned on when the voltage-drop-signal disappears to thereby discharge the capacitor.

* * * * *